United States Patent [19]
Liu et al.

[11] Patent Number: 4,611,328
[45] Date of Patent: Sep. 9, 1986

[54] POLARIZATION STABILIZED INGaAsP/INP LASERS

[75] Inventors: Jia-Ming Liu, Arlington, Mass.; Ying C. Chen, Closter, N.J.

[73] Assignee: GTE Laboratories Incorporated, Waltham, Mass.

[21] Appl. No.: 683,779

[22] Filed: Dec. 19, 1984

[51] Int. Cl.$^4$ .................................................. H01S 3/19
[52] U.S. Cl. .......................................... 372/45; 357/17
[58] Field of Search ............... 372/44, 45, 19; 357/17, 357/61

[56] References Cited

U.S. PATENT DOCUMENTS

| | | | |
|---|---|---|---|
| 4,340,966 | 7/1982 | Akiba et al. | 372/45 |
| 4,383,319 | 5/1983 | Shimizu et al. | 372/45 |
| 4,546,479 | 10/1985 | Ishikawa et al. | 372/45 |

OTHER PUBLICATIONS

S. Adachi, "Material Parameters of $In_{1-x}Ga_xAs_yP_{1-y}$ and related binaries", *J. Appl. Phys* 53(12), Dec. 1982, pp. 8775-8792.

*Primary Examiner*—James W. Davie
*Attorney, Agent, or Firm*—Martha A. Finnegan

[57] ABSTRACT

An InGaAsP laser structure having a support structure which contains an equal number of buffer layers and substrate layers is provided. The buffer layers of the support structure drastically reduce the tensile stress in the active layer, thereby eliminating the occurrence of undesired TM emission during normal operation. The semiconductor laser device of the present invention comprises: a support structure having one or more substrate layers and one or more buffer layers, the support structure containing an equal number of substrate layers and buffer layers, the substrate layers consisting of InP, the buffer layers consisting of $In_{1-x'}Ga_{x'}As_{y'}P_{1-y'}$ with $x' \simeq 0.47y'$ and $0 < y' \leq 1$, one of the substrate layers providing the lower surface of said semiconductor laser device; a first cladding layer of InP formed on the exposed buffer layer of the support structure; an active layer formed on the first cladding layer, the active layer consisting of $In_{1-x}Ga_xAs_yP_{1-y}$ with $x \simeq 0.47y$ and $y \leq y' \leq 1$ and a second cladding layer of InP formed on the active layer; and a cap layer of $In_{1-x''}Ga_{x''}As_{y''}P_{1-y''}$ with $x'' \simeq 0.47y''$ and $0 < y'' \leq 1$ formed on the second cladding layer; the buffer layers, first cladding layer, active layer, second cladding layer, and cap layer being substantially perfectly lattice-matched with the substrate layers at the growth temperature. Preferably, the buffer layers consist of $In_{0.53}Ga_{0.47}As$.

2 Claims, 11 Drawing Figures

POLARIZATION STABILIZED INGaAsP/INP LASERS

CROSS REFERENCE TO RELATED APPLICATION

U.S. patent application Ser. No. 683,776 by Liu and Chen filed on even date herewith for Fast-Polarization-Switchable Semiconductor Lasers which discloses related subject matter.

BACKGROUND OF THE INVENTION

Conventional InGaAsP/InP laser structures, including the planar buried heterostructure and the buried crescent heterostructure, consist of a thin InGaAsP active layer sandwiched between InP cladding layers on a thick InP substrate. In these structures, the internal stress, caused by lattice mismatch and the differential thermal expansion, exists mostly in the thin InGaAsP active layer. The stress is larger for lasers operating at longer wavelengths because of a larger compositional mismatch between the active layer and the surrounding InP layers, which results in a larger difference in the thermal expansion coefficients. Under usual liquid phase epitaxial (LPE) growth conditions, this stress tends to be tensile along the junction plane ($\sigma_{xx}>0$) at room temperature.

In U.S. patent application entitled "Fast Polarization-Switchable Semiconductor Lasers", Ser. No. 683,776 by Liu and Chen, filed concurrently herewith, a net tensile stress on the order of $10^8$ dyn/cm$^2$ is created in the active layer of a semiconductor laser to induce sufficient lattice deformation to promote a TM mode gain large enough to compete with the normal operating TE mode which allows the polarization of the laser output to be switched by varying injection current level. In various applications for the InGaAsP laser, the existence of net tensile stress in the active layer produces undesirable characteristics. For example, an InGaAsP/InP laser may change polarization with environmental temperature changes due to thermal stress in the active layer. In fact, InGaAsP/InP lasers are observed to operate in a mixture of TE and TM modes at room temperature under normal operating conditions. Furthermore, at high injection currents, kinks in the power-current characteristics associated with the appearance of higher order TM modes are observed in some InGaAsP/InP lasers. These kinks are caused by a combination of several effects. However, the stress in the active layer intensifies the problem. This problem is very important for InGaAsP/InP lasers operating in the wavelength range from 1.3 μm to 1.55 μm for optical communications. These problems do not exist in conventional AlGaAs/GaAs lasers with thin active layers because of their structural differences. The thermal stress in the active layer of an AlGaAs/GaAs laser induced by the thin cladding layers is compressive in the wavelength range from 8000 to 8500 Angstroms. Such compressive stress enhances the gain of the TE mode. In the longer wavelength range, the stress becomes tensile. However, the stress in the active layer of an AlGaAs/GaAs laser is always largely offset by the thick GaAs substrate whose composition is similar to that of the active layer.

SUMMARY OF THE INVENTION

In accordance with the present invention there is provided an InGaAsP laser structure having a support structure which contains an equal number of buffer layers and substrate layers. The buffer layers of the support structure drastically reduce the tensile stress in the active layer, thereby eliminating the occurrence of undesired TM emission during normal operation. When the thicknesses of the buffer layer and the substrate layer are optimized, the active layer can be stress-free at all temperatures. This is a very significant improvement as the laser will no longer exhibit polarization instabilities caused by environmental temperature changes and/or injection current changes. Release of the stress in the active layer will also increase the life expectancy and lower the threshold current of the laser. The InGaAsP laser structure of the present invention additionally allows fine tuning, after growth of the entire wafer, to achieve the stress-free condition by thinning the substrate to an optimal thickness.

In accordance with the present invention, there is provided a semiconductor laser device comprising:

a support structure having one or more substrate layers and one or more buffer layers, said support structure containing an equal number of substrate layers and buffer layers, said substrate layers consisting of InP, said buffer layers consisting of In$_{1-x'}$Ga$_{x'}$As$_{y'}$P$_{1-y'}$ with $x'\simeq 0.47y'$ and $0<y'\leq 1$, one of said substrate layers providing the lower surface of said semiconductor laser device and one of said buffer layers providing the upper surface of said support structure;

a first cladding layer of InP formed on said upper surface of said support structure;

an active layer formed on said first cladding layer, said active layer consisting of In$_{1-x}$Ga$_x$As$_y$P$_{1-y}$ with $x\simeq 0.47y$ and $y\leq y'\leq 1$;

a second cladding layer of InP formed on said active layer; and a cap layer of In$_{1-x''}$Ga$_{x''}$As$_{y''}$P$_{1-y''}$ with $x''\simeq 0.47y''$ and $0<y''\leq 1$ formed on said second cladding layer, wherein said buffer layers, said first cladding layer, said active layer, said second cladding layer, and said cap layer are substantially perfectly lattice-matched with said substrate layers at the growth temperature. Preferably, the buffer layers consist of In$_{0.53}$Ga$_{0.47}$As.

For a better understanding of the present invention, together with other and further objects, advantages and capabilities thereof, reference is made to the following disclosure and appended claims in connection with the above-described drawings.

DETAILED DESCRIPTION OF THE INVENTION

Figure 1A:
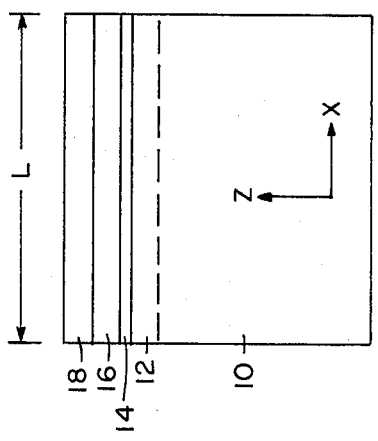
FIG. 1(a) is a representation of a typical conventional InGaAsP/InP laser device.

It is generally true for conventional buried heterostructure lasers that the laser cavity length is from about 50 to 100 times larger than the active region stripe width. The cavity length is usually at least 50 μm. The stress problem in the conventional structure can be reduced to a one-dimensional problem. FIG. 1(a) represents the multilayer structure of a typical conventional InGaAsP/InP laser. The typical conventional InGaAsP/InP laser includes an n-InP substrate 10, an n-InP first cladding layer 12, an $In_{1-x}Ga_xAs_yP_{1-y}$ active layer 14, a p-InP second cladding layer 16, and an $In_{1-x}Ga_xAs_yP_{1-y}$ cap layer 18. In a typical convention InGaAsP/InP structure, the n-InP substrate 10 has a thickness, $d_s$, of 80 μm; the n-InP first cladding layer 12 has a thickness, $d_{c1}$, of 1 μm; the $In_{1-x}Ga_xAs_yP_{1-y}$ active layer 14 has a thickness, $d_a$, of 0.2 μm; the p-InP second cladding layer 16 has a thickness, $d_{c2}$, of 1 μm; and the $In_{1-x}Ga_xAs_yP_{1-y}$ cap layer 18 has a thickness, $d_t$, of 1 μm. However, these thicknesses may be varied.

Assuming perfect lattice-match of the layers at the growth temperature, $T_g$, the stress in the active layer at the device operation temperature, T, caused by thermal strain in the multilayer structure of FIG. 1(a) can be expressed by $$\sigma_{xx} = \frac{E}{1-\nu}\left( -\frac{d_s + d_{c1} + d_{c2}}{d}\Delta\alpha\Delta T + \frac{1}{2R}(d_s + d_{c1} - d_{c2} - d_t) \right),$$

wherein $\frac{1}{R} = \frac{6}{d^3}\Delta\alpha\Delta T\{(d_s + d_{c1})(d_a + d_t) + d_{c2}(d_t - d_a)\}$;

E is the Young's modulus; $\nu$ is the Poisson's ratio; $\Delta\alpha = {}^\alpha InGaAsP - {}^\alpha InP$, which is the difference of thermal expansion coefficients of the active layer and substrate; $\Delta T = T - T_g$, which is the difference between the device operation temperature, T, and the growth temperature, $T_g$; d is the overall thickness of the device; $d_s$ is the thickness of the substrate; $d_{c1}$ is the thickness of the first cladding layer; $d_a$ is the thickness of the active layer; $d_{c2}$ is the thickness of the second cladding layer; $d_t$ is the thickness of the cap layer. For the purpose of these calculations, it is assumed that the composition of the cap layer is the same as the composition of the active layer. Throughout the following analysis the growth temperature is chosen to be 650° C., and the difference between the room temperature and the growth temperature to be −630° C. The literature reports thermal expansion coefficients for $In_{1-x}Ga_xAs_yP_{1-y}$ lattice-matched to InP for compositions wherein y=0, 0.6, and 1. The thermal coefficients are $\alpha = 4.56\times 10^{-6}$/°C. for InP (y=0), $\alpha = 5.42\times 10^{-6}$/°C. for $In_{0.74}Ga_{0.26}As_{0.60}P_{0.40}$ (y=0.6, λ=1.30 μm), and $\alpha = 5.66\times 10^{-6}$/°C. for $In_{0.53}Ga_{0.47}As$ (y=1). For other compositions, $\alpha$ (y)=(4.56+1.266y)×$10^{-6}$/°C., varying linearly with y. The Young's modulus, E, varies only slightly with y. The calculations are based upon a (100) substrate and a constant effective $(E/1-\nu)_{(100)} = 9.487\times 10^{11}$ dyn/cm², where $\nu$ is the Poisson's ratio. The positive values of the stress $\sigma_{xx}$ in the active layer are tensile along the junction plane, which corresponds to a negative lattice mismatch and a lattice deformation in the active layer with a lattice constant normal to the junction smaller than that along the junction.

Figure 2:
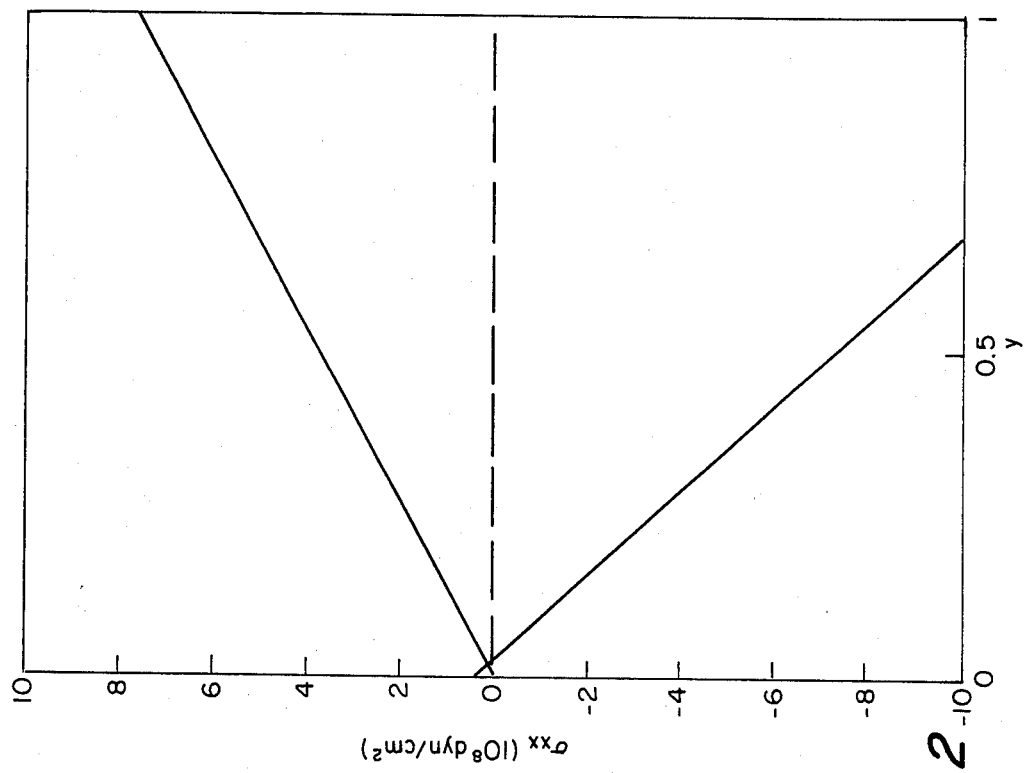
FIG. 2 shows the active layer stress at room temperature, at 20° C., for the structures of typical conventional InGaAsP/InP and AlGaAs/GaAs as a function of the As content, y, in the active layer of the InGaAsP/InP structure and the Al content, y, in the active layer of the AlGaAs structure, respectively; assuming perfect lattice-match of all layers at the growth temperature (650° C. for InGaAsP/InP and 900° C. for AlGaAs/GaAS).

In order to grow good epitaxial layered structures for laser devices, it is crucial to control the liquid phase epitaxial (LPE) growth conditions so that there is close to perfect lattice-matching between the layers of the laser device at the growth temperature (typically 600° C. to 650° C.). Because the $In_{1-x}Ga_xAs_yP_{1-y}$ material has a larger thermal expansion coefficient than that of InP, it is possible to have perfect lattice-match and stress-free conditions for the conventional device at only one temperature in the temperature range between the growth temperature and the device operation temperature. The upper part of FIG. 2 shows the stress $\sigma_{xx}$ at room temperature for the structure in FIG. 1(a) as a function of the As content, y, in the active layer, assuming perfect lattice-matching at the growth temperature 650° C. If a lower temperature between the growth and the device operation temperatures is chosen for perfect lattice-match, as is usually done to compromise the lattice-matching requirements at the two extreme temperatures, the tensile stress in the active layer can be reduced linearly.

Figure 1B:
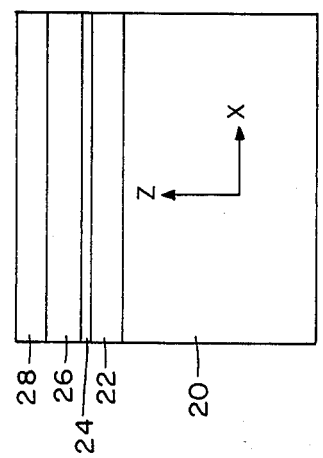
FIG. 1(b) is a representation of a typical conventional AlGaAs/GaAs laser device.

FIG. 1(b) represents the multilayer structure of a typical conventional AlGaAs/GaAs laser. The typical conventional AlGaAs/GaAs laser includes an n-GaAs substrate 20, an n-Al$_x$Ga$_{1-x}$As cladding layer 22, an Al$_y$Ga$_{1-y}$As active layer 24, a p-Al$_x$Ga$_{1-x}$As cladding layer 26, and a GaAs cap layer 28.

Following is a stress analysis for a typical conventional AlGaAs/GaAs laser having an n-GaAs substrate 20 with a thickness, $d_s$, of 80 μm, an n-Al$_x$Ga$_{1-x}$As cladding layer 22 with a thickness, $d_{c1}$ of 1 μm, an Al$_y$Ga$_{1-y}$As active layer with a thickness, $d_a$ of 0.2 μm, a p-Al$_x$Ga$_{1-x}$As cladding layer 26 with a thickness, $d_{c2}$, of 1 μm, and a GaAs cap layer 28 with a thickness, $d_t$, of 1 μm. However, these thicknesses may be varied. For the purpose of comparison, the thicknesses of the AlGaAs/GaAs structure used in the stress analysis are chosen to be the same as the corresponding layer thickness used above in the stress analysis for the InGaAsP/InP laser structure. This stress analysis for the typical conventional AlGaAs/GaAs laser structure is provided to show the difference between the stress in the typical conventional InGaAsP/InP laser and the typical conventional AlGaAs/GaAs laser. Because GaAs and AlAs have a perfect lattice-match at 900° C., the AlGaAs/GaAs structure is always grown perfectly lattice-matched at the growth temperature. With the growth temperature equal to 900° C., the difference between the growth temperature and the room temperature is approximately −880° C. The known thermal expansion coefficients are $\alpha = 6.78 \times 10^{-6}/°$ C. for GaAs, and $\alpha = 5.2 \times 10^{-6}/°$ C. for AlAs. For ternary compositions, Al$_y$Ga$_{1-y}$As, a linear function $\alpha(y) = (6.78 - 1.58y) \times 10^{-6}/°$ C. is expected and assumed. A (100) GaAs substrate and a constant effective $(E/1-v)(100) = 12.39 \times 10^{11}$ dyn/cm$^2$ is also assumed throughout the following stress analysis for the typical AlGaAs/GaAs laser structure. The composition difference between the cladding layers (Al$_x$Ga$_{1-x}$As) and the active layer (Al$_y$Ga$_{1-y}$As) is kept at $x - y = 0.25$. The calculated stress, $\sigma_{xx}$, at room temperature for the AlGaAs/GaAs structure of FIG. 1(b) is shown in the lower part of FIG. 2 as a function of the aluminum content, y, in the active layer. Substantial differences between the InGaAsP/InP and the AlGaAs/GaAs structures can be seen in the active-layer stresses in FIG. 2. The differences between the active layer stresses of the two types of laser devices are due to the relationship among the layers in the two structures. In the InGaAsP/InP structure, most of the stress is in the active layer, whereas most of the stress in the AlGaAs/GaAs structure exists in the cladding layers rather than in the active layer. Therefore, a typical AlGaAs/GaAs laser is not subject to the problem of stress-induced polarization instabilities.

Figure 3A:
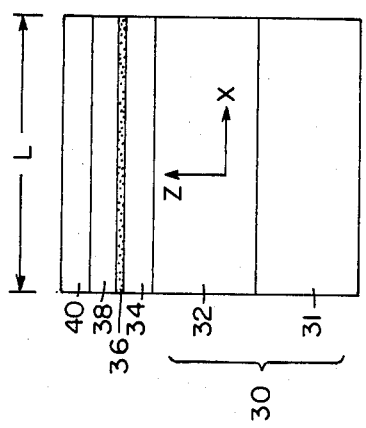
FIG. 3(a) is a representation of an InGaAsP/InP laser device in accordance with the present invention with a support structure having a single substrate layer and a single buffer layer.
Figure 3B:
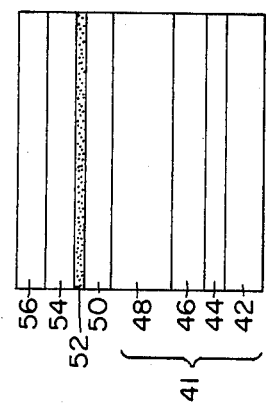
FIG. 3(b) is a representation of a buffered InGaAsP/InP laser device in accordance with the present invention with a support structure having more than one substrate layer and more than one buffer layer.

The InGaAsP/InP laser device of the present invention contains a buffer layer disposed between a substrate layer and the first cladding layer, which underlies the active layer. The device of the present invention must have buffer layer(s), cladding layers, an active layer, and a cap layer which are substantially perfectly lattice-matched with the substrate layer(s) at the growth temperature. That is the lattice deformation in the device should be $\leq \Delta a/a \simeq 10^{-5}$. In order for In$_{1-x}$Ga$_x$As$_y$P$_{1-y}$ to be lattice-matched to InP, the following relationship must exist between x and y for any In$_{1-x}$Ga$_x$As$_y$P$_{1-y}$ composition:

$$x = \frac{0.1894y}{0.4184 - 0.013y}$$

and $0 \leq y \leq 1$; and more simply $x \simeq 0.47y$ and $0 \leq y \leq 1$. S. Adachi, J. Appl. Phys. 53, 8775 (1982). Two embodiments of InGaAsP/InP laser device in accordance with the present invention are represented in FIGS. 3(a) and 3(b). The device of the present invention represented in FIG. 3(a) comprises a support structure 30 having one n-InP substrate layer 31, and one In$_{1-x'}$Ga$_{x'}$As$_{y'}$P$_{1-y'}$ buffer layer 32 in which $x' \simeq 0.47y'$ and $0 \leq y' \leq 1$, the substrate layer forming the lower surface of the laser device; a first cladding layer consisting of n-InP 34, an active layer of In$_{1-x}$Ga$_x$As$_y$P$_{1-y}$ 36 in which x 0.47y and $0 < y \leq y' \leq 1$, a second cladding layer consisting of p-InP 38, and a cap layer consisting of In$_{1-x''}$Ga$_{x''}$As$_{y''}$P$_{1-y''}$ 40 in which $x'' \simeq 0.47y''$ and $0 < y'' \leq 1$. The cap layer usually has the same composition of the active layer. Although it is not necessary for the composition of the active layer and the cap to be the same. The forbidden bandgap of the buffer layer should be less than or equal to the forbidden bandgap of the active layer which in turn should be less than the forbidden bandgap of the InP cladding layers.

An alternative embodiment of the present invention is shown in FIG. 3(b). The device shown in FIG. 3(b) has a support structure 41 having more than one substrate layer and more than one buffer layer, the number of buffer layers being equal to the number of substate layers. When the support structure has 1 buffer layer and 1 substrate layer, the layers must be alternating with a layer of substrate forming the lower surface of the laser device. The device shown in FIG. 3(b) comprises a first InP substrate layer 42, a first In$_{1-x'}$Ga$_{x'}$As$_{y'}$P$_{1-y'}$ buffer layer 44 with x' 0.47y' and $0 < y' \leq 1$, a second InP substrate layer 46, and a second In$_{1-x'}$Ga$_{x'}$As$_{y'}$P$_{1-y'}$ buffer layer 48 with $x' \simeq 0.47y'$ and $0 < y' \leq 1$. A first cladding layer of n-InP 50 is formed upon the second buffer layer 48 of the alternating buffered substrate 41. The In$_{1-x}$Ga$_x$As$_y$P$_{1-y}$ active layer 52 in which $x \simeq 0.47y$ and $0 < y \leq y' \leq 1$ is sandwiched between the first cladding layer 50 and a second cladding layer of p-InP 54. The second cladding layer 54 is topped with a cap layer of In$_{1-x''}$Ga$_{x''}$As$_{y''}$P$_{1-y''}$ 56 in which $x'' \simeq 0.47y''$ and $0 < y'' \leq 1$. Again, the cap layer usually has the same composition as the active layer, although it is not necessary for the compositions of the cap layer and active layer to be the same. The alternating buffered substrate support structure 41 could further contain additional alternating substrate and buffer layers.

Assuming perfect lattice-match of the layers at the growth temperature, Tg, the stress in the active layer at the device operation temperature, T, caused by thermal strain in the multilayer structure of FIG. 3(a) can be expressed by $$\sigma_{xx} = \frac{E}{1-v} \left\{ -\frac{d_s + d_{c1} + d_{c2}}{d} \Delta\alpha\Delta T + \frac{d_b}{d} \Delta\alpha'\Delta T + \frac{1}{2R}(d_s + d_b + d_{c1} - d_{c2} - d_t) \right\},$$

where $\frac{1}{R} = \frac{6\Delta T}{d^3} \{[d_s(d_b + d_a + d_t) - d_b(d_{c1} + d_{c2}) + d_{c1}(d_a + d_t) - d_{c2}(d_a - d_t)]\Delta\alpha +$ $d_b(d_s - d_{c1} - d_a - d_{c2} - d_t)\Delta\alpha'\}$, E is the Young's modulus; $\nu$ is the Poisson's ratio; $\Delta\alpha = \alpha_a - \alpha_s = \alpha$ (active layer) $-\alpha$ (substrate); $\Delta\alpha' = \alpha_b - \alpha_a = \alpha$(buffer layer)$-\alpha$(active layer); $\Delta T = T - Tg$, which is the difference between the device operation temperature, T, and the growth temperature, Tg, d is the overall thickness of the device; $d_s$ is the thickness of the substrate; $d_b$ is the thickness of the buffer layer; $d_{c1}$ is the thickness of the first cladding layer; $d_a$ is the thickness of the active layer; $d_{c2}$ is the thickness of the second cladding layer; $d_t$ is the thickness of the cap layer. For the purpose of calculating the stress in the active layer of the multilayer structure of FIG. 3(b), the total of the thicknesses of the individual buffer layers is equivalent to $d_b$ and the total of the individual InP substrate layers is $d_s$. By defining $d_b$ and $d_s$ for the alternating structure design in this manner, the above formulas can be used to calculate the stress in the active layer. The thicknesses of the cap layer, the first and second cladding layers, and the active layer in the laser device of the present invention are similar to the thicknesses of the corresponding layers in typical InGaAsP/InP laser devices. For example, the thickness of the cap layer, $d_t$, is typically selected to be greater than 0 $\mu$m, but less than or equal to $\simeq 1$ $\mu$m; the thickness of the first cladding layer, $d_{cl}$ is selected typically to be greater than or equal to about 1 $\mu$m, but less than or equal to about 3 $\mu$m; the thickness of the second cladding layer, $d_{c2}$, is typically selected to be greater than or equal to about 1 $\mu$m, but less than or equal to about 3 $\mu$m; and the thickness of the active layer, $d_a$, is typically selected to be greater than or equal to about 0.05 $\mu$m, but less than or equal to about 0.3 $\mu$m. However, these thicknesses are given only by way of example and may be varied without affecting the polarization stability of the laser device of the present invention.

Figure 4:
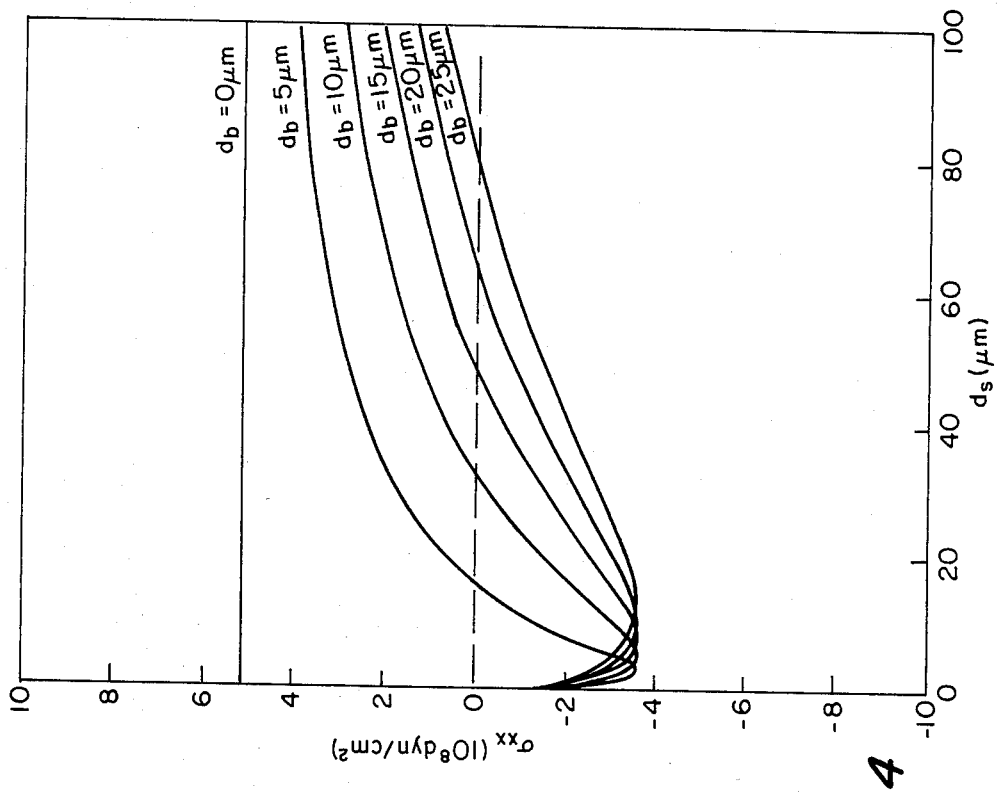
FIG. 4 shows active layer stress at room temperature for a laser at 1.3 μm (y=0.6) with a structure in accordance with the present invention as a function of the substrate thickness, $d_s$, for several thicknesses of the buffer layer, $d_b$.
Figure 5:
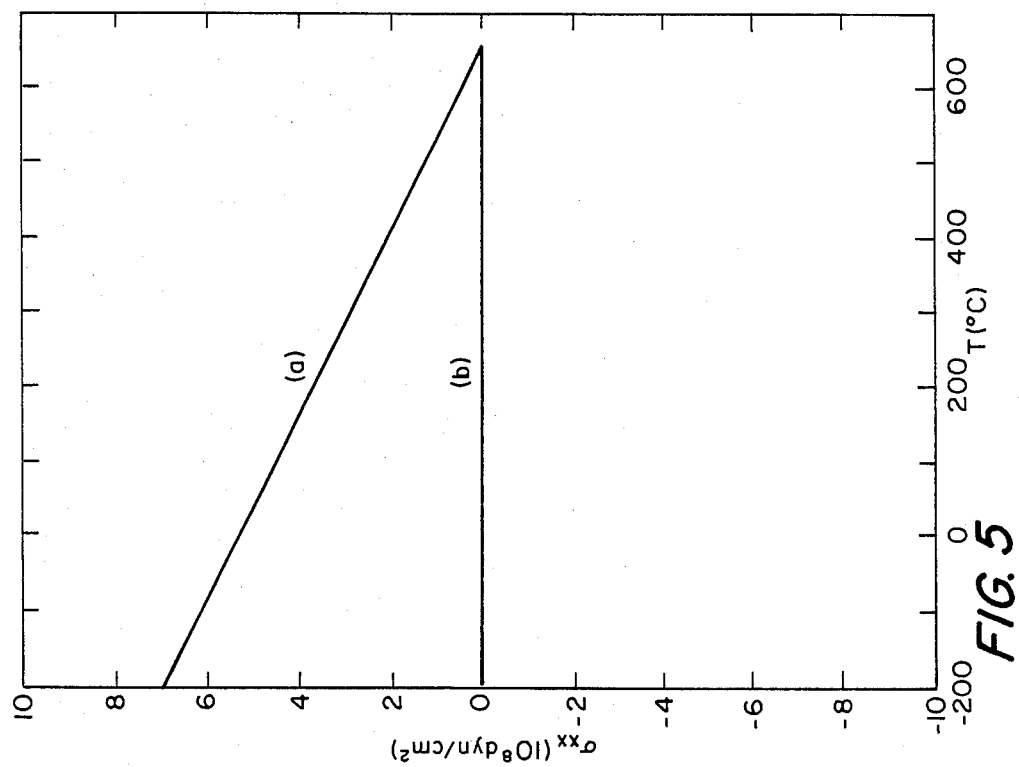
FIG. 5 shows the temperature dependence of the active layer stress for lasers at 1.3 μm which have the typical conventional InGaAsP/InP structure (curve (a)) and the InGaAsP/InP structure of the present invention with a single buffer layer and single substrate layer, (curve (b)).

The buffer layer in the InGaAsP/InP laser device of the present invention preferably consists of $In_{0.53}Ga_{0.47}As$. $In_{0.53}Ga_{0.47}As$ is the preferred material for use as the buffer layer material because $In_{0.53}Ga_{0.47}As$ has the largest thermal expansion coefficient among $In_{1-x'}Ga_{x'}As_{y'}P_{1-y'}$ materials; and by controlling lattice-matching conditions at growth temperature, a thicker misfit dislocation-free $In_{0.53}Ga_{0.47}As$ layer can be grown on (100) InP substrate than other $In_{1-x'}Ga_{x'}As_{y'}P_{1-y'}$ layers. K. Nakajima et al., J. Appl. Phys. 52 4575 (1981). The stress $\sigma_{xx}$ at room temperature for a laser at 1.3 $\mu$m (y=0.6) grown under perfect lattice-matching conditions at 650° C. is shown in FIG. 4 as a function of the substrate thickness, $d_s$, for several thicknesses of the $In_{0.53}Ga_{0.47}As$ buffer layer, $d_b$. Without the buffer layer, the structure reduces to the typical conventional InGaAsP/InP structure shown in FIG. 1(a). FIG. 4 shows that if the typical conventional InGaAsP/InP structure is grown stress-free at the growth temperature, a large tensile stress, almost independent of the substrate thickness, always exists in the active layer. When a buffer layer of reasonable thickness is introduced, it is possible to optimize the substrate thickness, for example, by thinning, so that the active layer of the laser device is stress-free both at the growth temperature and at room temperature. FIG. 5 illustrates that the active layer of the structure of the present invention is stress-free at all temperatures in this optimized condition, which is not possible for a laser structure not having a buffer layer sandwiched between the substrate and first cladding layer. Curve (a) of FIG. 5 shows the temperature dependence of the active layer stresses for lasers at 1.3 $\mu$m (y=0.6) which have the typical conventional structure. Curve(b) shows the temperature dependence of active layer stresses for lasers at 1.3 $\mu$m (y=0.6) which have the InGaAsP/InP structure of the present invention with a single substrate layer and single buffer layer. The active layer of the typical convention structure of Curve(a) is stress-free only at the 650° C. growth temperature while the active layer of the structure of the present invention Curve(b), is stress-free at all temperatures.

The thickness of the buffer layer required to achieve the stress-free condition in the active layer depends on the composition of the InGaAsP material in the active layer and the thickness of the substrate. However, the requisite buffer layer thickness does not change appreciably when the thicknesses of other layers are changed within a reasonable range.

A device in accordance with the present invention could have, for example, a cap layer with a thickness, $d_t$, of $\simeq 1$ $\mu$m; an active layer with a thickness, $d_a$, of 0.2 $\mu$m; a first cladding layer with a thickness, $d_{c1}$, of 1 $\mu$m; and a second cladding layer with a thickness, $d_{c2}$, of 1 $\mu$m.

Figure 6:
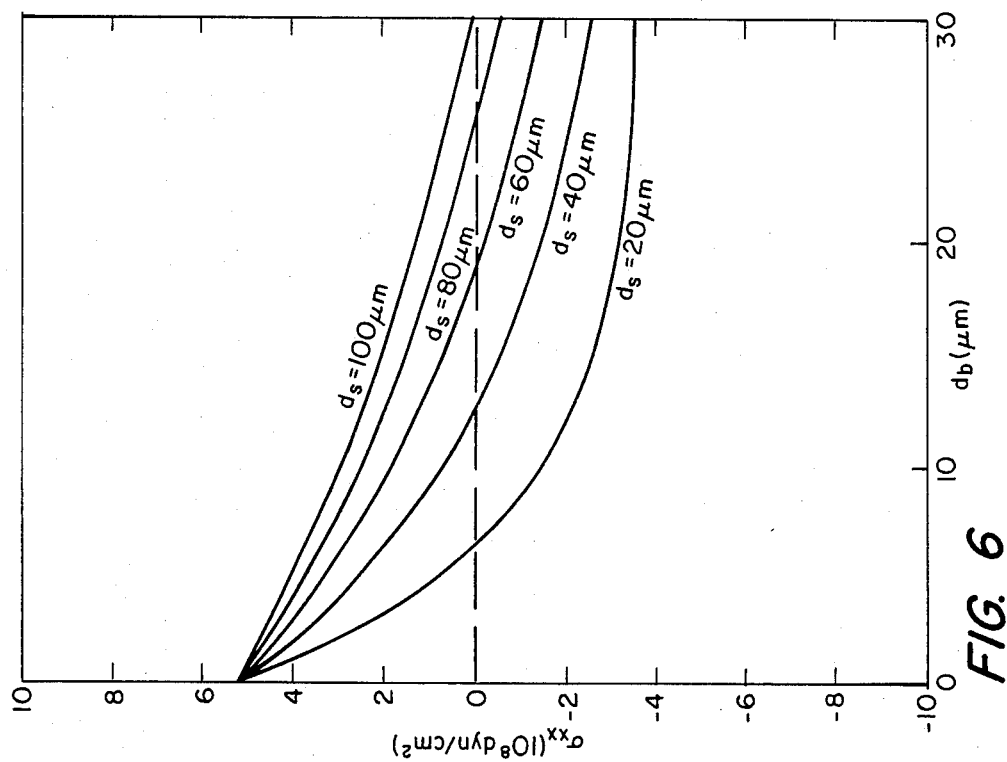
FIG. 6 shows active layer stress at room temperature for a laser at 1.3 μm (y=0.6) with the structure of the present invention shown in FIG. 3(a), as a function of the buffer layer thickness, $d_b$, for various substrate thickness, $d_s$.
Figure 8:
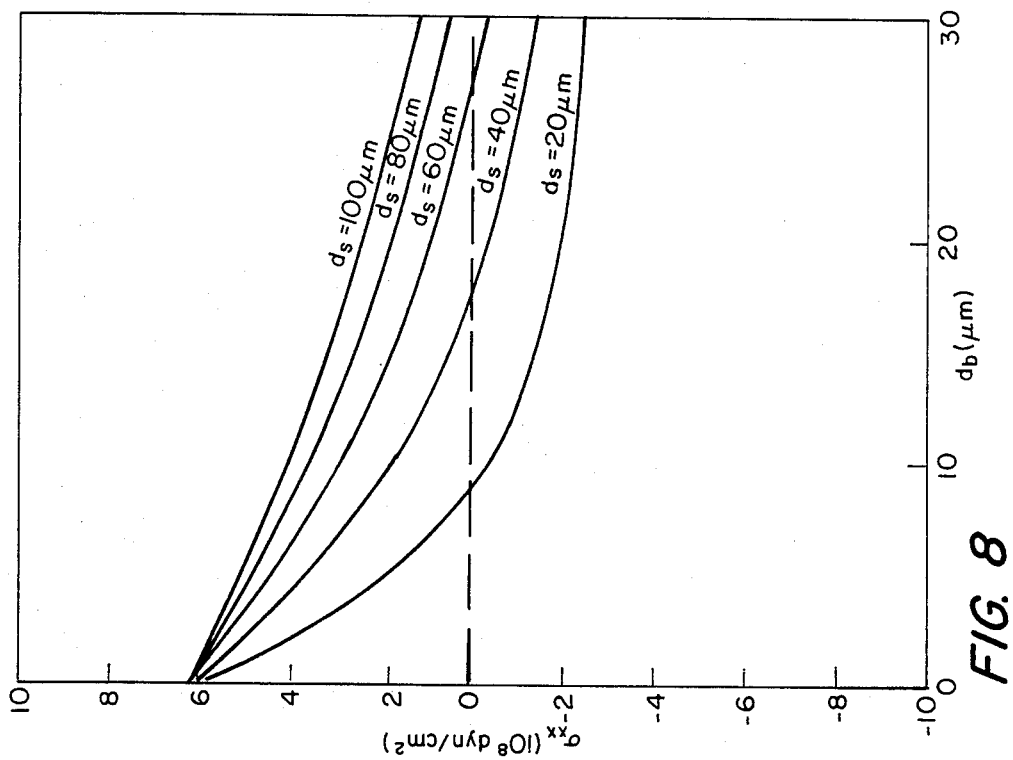
FIG. 8 shows active layer stress at room temperature for a laser at 1.55 μm (y=0.9) with the structure of the present invention shown in FIG. 3(a), as a function of the buffer layer thickness, $d_b$, for various substrate thickness, $d_s$.
Figure 7:
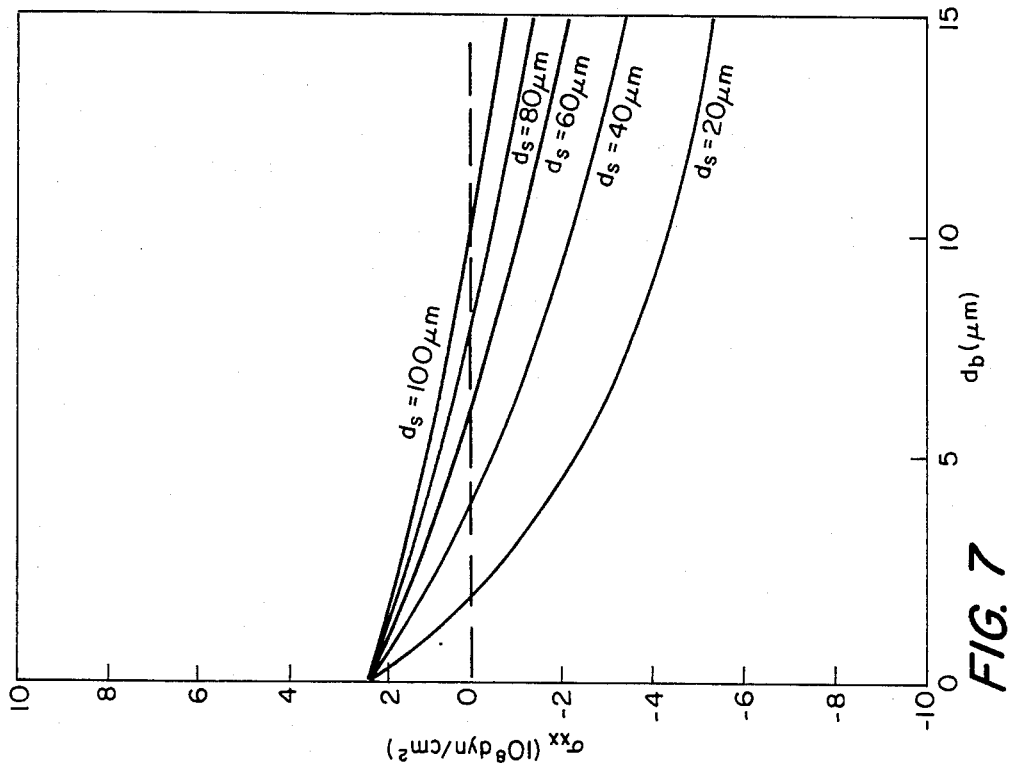
FIG. 7 shows active layer stress at room temperature for a laser at 1.08 μm (y=0.3) with the structure of the present invention shown in FIG. 3(a), as a function of the buffer layer thickness, $d_b$, for various substrate thickness, $d_s$.

Therefore, the results obtained from calculations for the laser devices of the present invention as illustrated in FIGS. 3(a) and 3(b) can be used as general guidelines for the optimal design of stress-free structures. The calculated active layer stress, $\sigma_{xx}$ for the laser structure of the present invention at $\lambda = 1.30$ $\mu$m (y=0.6) is shown in FIG. 6 as a function of the thickness, $d_b$, of the buffer layer for various substrate thicknesses. FIGS. 7 and 8 show similar plots for lasers at two other wavelengths, $\lambda = 1.08$ $\mu$m (y=0.3) and $\lambda = 1.55$ $\mu$m (y=0.9), respectively. The buffer layer material in the devices represented by FIGS. 6–8 is $In_{0.53}Ga_{0.47}As$. It is possible to determine from the plots of FIGS. 6 through 8 the relationship of the optimal buffer layer thickness $d_b$ and substrate thickness $d_s$ for stress-free structures at these three laser wavelengths. For laser wavelengths other than 1.08 $\mu$m, 1.30 $\mu$m, and 1.55 $\mu$m or structures using different buffer layer compositions, optimum thicknesses for $d_b$ and $d_s$ can be calculated in a similar fashion.

Figure 9:
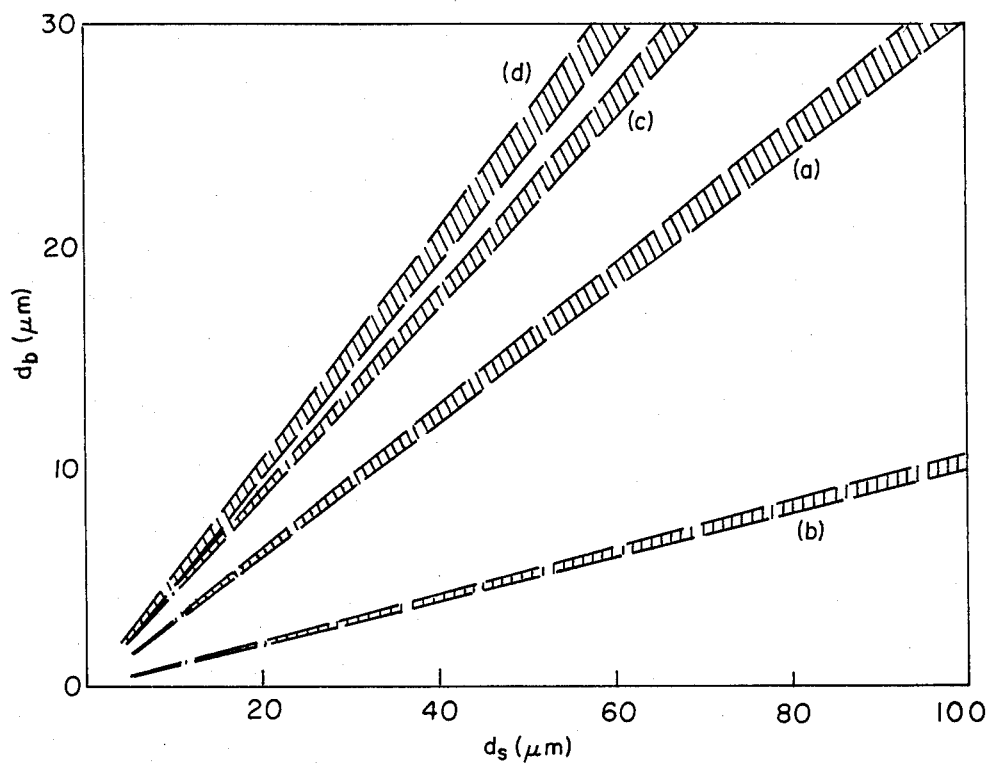
FIG. 9 shows expected optimal relationships between the thicknesses of the buffer layer and the substrate for the stress-free condition for (a) 1.3 μm (b) 1.08 μm (c) 1.55 μm structures with an InGaAs buffer layer, and (d) a 1.3 μm structure with an $In_{0.74}Ga_{0.26}As_{0.60}P_{0.40}$ buffer layer. Each pair of traces shows a stress tolerance of $\pm 10^7$ dyn/cm².

In FIG. 9, curve (a) shows the $d_b - d_s$ relationship for a stress-free laser device in accordance with the present invention employing $In_{0.53}Ga_{0.47}As$ as the buffer layer material at $\lambda = 1.30$ $\mu$m. Curve (b) shows the $d_b - d_s$ relationship for a stress-free laser device in accordance with the present invention which uses $In_{0.53}Ga_{0.47}As$ as the buffer material at $\lambda = 1.08$ $\mu$m. Curve (c) shows the $d_b - d_s$ relationship for a stress-free laser device of the present invention which utilizes $In_{0.53}In_{0.47}As$ as the buffer layer material at $\lambda = 1.55$ $\mu$m. Curve (d) shows the $d_b - d_s$ relationship for a stress-free laser device in accordance with the present invention using $In_{0.74}Ga_{0.26}As_{0.60}P_{0.40}$ as the buffer layer material at $\lambda = 1.30$ $\mu$m. The device represented by curve (d) of FIG. 9 has a buffer layer consisting of the same material as the $In_{0.74}Ga_{0.26}As_{0.60}P_{0.40}$ active layer. FIG. 9 shows the optimal $d_b = d_s$ relationships with a tolerance of $\sigma_{xx} = \pm 10^7$ dyn/cm$^2$. It is clear from FIG. 9 that it is not difficult to control $\sigma_{xx}$ within $\pm 10^7$ dyn/cm$^2$ since the tolerances for $d_b$ and $d_s$ to meet this condition are quite large. Notice that a stress of $10^7$ dyn/cm$^2$ corresponds to a negligible lattice deformation of $\Delta a/a = -10^{-5}$ which is far below the amount of lattice deformation that promotes the TM emission. See U.S. patent application Ser. No. 683,776 entitled, "Fast Polarization-Switchable Semiconductor Lasers" by Liu and Chen, filed concurrently herewith.

A comparison of curves (a) and (d) of FIG. 9 indicates that for a given substrate thickness, a thinner $In_{0.53}Ga_{0.47}As$ buffer layer is needed to achieve the stress-free condition than is needed for a buffer $In_{x'}Ga_{1-x'}As_{y'}P_{1-y'}$ wherein $y'\neq 1$. $In_{0.53}Ga_{0.47}As$ is the preferred buffer layer material since the growth of a very thick misfit dislocation-free $In_xGa_{1-x}As_yP_{1-y}$ layer on the InP substrate is known to give rise to some practical difficulties.

FIG. 9 also shows that for lasers operating at longer wavelengths, a thicker buffer layer is needed for a given substrate thickness. In practice, it may be difficult to grow misfit dislocation-free $In_{0.53}Ga_{0.47}As$ layers thicker than 15 μm on an InP substrate. Where an InGaAs layer thicker than 15 μm is indicated, the substrate should be thinned down sufficiently to conform to the stress-free $d_b - d_s$ relationship. In those instances in which a very thin substrate is not desirable, the alternating-layer structure shown in FIG. 3(b) can be used to circumvent the problem. In this structure, alternating $In_{0.53}Ga_{0.47}As$ and InP layers of practical thicknesses can be grown and the InP substrate can be thinned afterward. For the purpose of calculating the stress in the active layer, the total of the thicknesses of the individual InGaAs buffer layers is equivalent to $d_b$ and the total of the individual InP substrate layers is $d_s$. By defining $d_b$ and $d_s$ for the alternating structure design in this manner, FIG. 9 can be used for optimal design of the structure.

While there has been shown and described what are considered preferred embodiments of the present invention, it will be obvious to those skilled in the art that various changes and modifications may be made therein without departing from the invention as defined by the appended claims.

What is claimed is:

1. A semiconductor laser device comprising:
   a support structure having one or more substrate layers and one or more buffer layers, said support structure containing an equal number of substrate layers and buffer layers, said substrate layers consisting of InP, and said buffer layers consisting of $In_{1-x'}Ga_{x'}As_{y'}P_{1-y'}$ with $x'\simeq 0.47y'$ and $0<y'\leq 1$, one of said substrate layers providing the lower surface of said semiconductor laser device and one of said buffer layers providing the upper surface of said support structure;
   a first cladding layer of InP formed on said upper surface of said support structure;
   an active layer formed on said first cladding layer, said active layer consisting of $In_{1-x}Ga_xAs_yP_{1-y}$ with $x\simeq 0.47y$ and $y\leq y'\leq 1$, $y>0$;
   a second cladding layer of InP formed on said active layer; and
   a cap layer of $In_{1-x}Ga_xAs_yP_{1-y}$ with $x''\simeq 0.47y''$ and $0<y''\leq 1$ formed on said second cladding layer;
   wherein said buffer layers, said first cladding layer, said active layer, said second cladding layer, and said cap layer are substantially perfectly lattice-matched with said substrate layers at the growth temperature.

2. A semiconductor laser device in accordance with claim 1 wherein said buffer layers consist of $In_{0.53}Ga_{0.47}As$.

* * * * *